United States Patent [19]

Culley et al.

[11] Patent Number: 4,956,691

[45] Date of Patent: Sep. 11, 1990

[54] NMOS DRIVER CIRCUIT FOR CMOS CIRCUITRY

[75] Inventors: Jeffrey L. Culley, West Lafayette; Darrell E. Frazier; Anthony E. Frisch, both of Kokomo, all of Ind.

[73] Assignee: Delco Electronics Corporation, Kokomo, Ind.

[21] Appl. No.: 328,264

[22] Filed: Mar. 24, 1989

[51] Int. Cl.$^5$ ............................................. H01L 27/02
[52] U.S. Cl. ........................................ 357/41; 357/40; 307/448; 307/475; 307/279; 307/270; 307/446
[58] Field of Search ..................... 357/41, 40; 307/448, 307/475, 279, 270, 446

[56] References Cited

U.S. PATENT DOCUMENTS 4,553,051  11/1985  Prater .............................. 307/279 X Primary Examiner—Rolf Hille
Assistant Examiner—R. Potter
Attorney, Agent, or Firm—Robert J. Wallace

[57] ABSTRACT

A driver circuit, which uses two serially connected enhancement mode n-channel MOS transistors in which the pullup transistor of the two transistors has no p-type implant in the channel region thereof and the pulldown transistor of the pair is a normlal enhancement mode transistor having a p-type threshold control implant in the channel thereof, is useful as a driver circuit for CMOS circiuts. The pullup transistor is designed to have a threshold of about 0 volts at zero back gate bias and the pulldown transistor is designed to have a threshold voltage of about 0.7 volts at zero back gate bias.

16 Claims, 4 Drawing Sheets

//

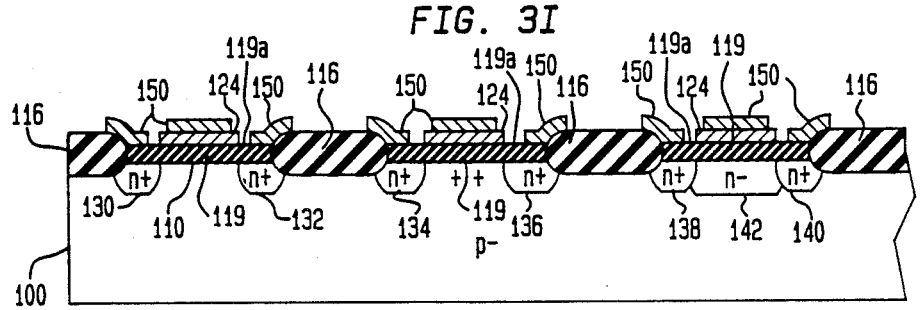

NMOS DRIVER CIRCUIT FOR CMOS CIRCUITRY

FIELD OF THE INVENTION

This invention relates to semiconductive integrated circuits and, more particularly, relates to metal-oxide-semiconductor (MOS) transistor circuitry.

BACKGROUND OF THE INVENTION

In some applications, an integrated circuit chip that uses only n-channel MOS (NMOS) transistors must communicate with another integrated circuit chip that uses a complementary MOS (CMOS) transistor pair (a PMOS and an NMOS transistor) as its input. Such CMOS circuits typically require a significant input voltage swing, e.g., such as between 0.3 Vdd and 0.7 Vdd, where Vdd is a positive voltage coupled to the source of the PMOS transistor of the input CMOS pair and ground potential is coupled to the source of the NMOS transistor of the CMOS pair whose drain is coupled to the drain of the PMOS transistor, in order to provide a reliable recognizable input change.

One solution to this problem is to include a p-channel enhancement transistor on the same chip as the n-channel transistors and to use it in series with an n-channel transistor. This solution, in effect, results in the chip becoming a CMOS type integrated circuit, which adds considerable complexity to the fabrication process and is undesirable in some applications.

One prior art driver circuit often used as an output driver on an n-channel transistor chip is shown as driver circuit 10 in FIG. 1. Driver circuit 10 essentially comprises a first n-channel enhancement mode MOS transistor 12 and a second n-channel enhancement mode MOS transistor 14 with the source of transistor 12 being connected to the drain of transistor 14 and to an output terminal 18, with the drain of transistor 12 coupled to a positive voltage source Vdd, and with the source of transistor 14 coupled to ground potential. The gate of transistor 12 is coupled to an input terminal 13 and to an input of an inverter 16 which has an output that is connected to the gate of transistor 14 and to a terminal 15. The channels of NMOS transistors 12 and 14 are shown with two "+'s" in each to indicate that a conventional p-type implant was made into the channel of each to raise the threshold voltages and help prevent unwanted inversion of the channels. This implant is important to overcome the natural tendency of the surface of the channel of an NMOS transistor, formed in a typical lightly doped p-type substrate, otherwise to behave as n-type, in which case the transistor can act as a depletion mode transistor with appreciable surface current between the heavily doped source and drain of the transistor, even without any applied gate voltage. The implant is used to set the potential of the surface and thereby to insure that the transistor operate in the desired enhancement mode. Typically, the implant is used to increase the surface doping to about $1 \times 10^{16}$ impurities/cm$^3$ while the bulk of the p-type substrate (not shown) retains its original doping, typically about $1 \times 10^{15}$ impurities/cm$^3$. Inverter 16 is used to insure that opposite logic signals are applied to the gates of transistors 12 and 14.

With a "1" input signal (e.g., a voltage level at or near the voltage level of Vdd) applied to input terminal 13, transistor 12 is biased on (enabled) and transistor 14 is biased off (disabled). These conditions cause output terminal 18 to assume a voltage level of Vdd less the Vth (threshold of transistor 12). Typically, Vth of transistor 12 is about +0.7 volts (plus or minus 0.2 volts) with a zero back gate bias for the example mentioned where the impurity concentration of the p-type substrate (not shown in this figure) on which transistor 12 is fabricated is $1 \times 10^{15}$ impurities/cm$^3$ and the p-type implant into the channel region of transistor 12 result in increasing the impurity concentration in the channel region to about $1 \times 10^{16}$ impurities/cm$^3$. In some applications, including applications in which a CMOS inverter circuit is to be the load connected to output terminal 18, the output voltage representing a "1" is not high enough to reliably switch the load circuit. In such case, a buffer circuit or voltage multiplier circuit must be inserted between the driver circuit and the load for reliable operation.

The above described prior art two serially connected n-channel MOS transistor driver circuit can be modified to include bootstrapping circuitry so as to increase the gate potential of the first transistor.

This modified circuit can generate higher output "1" levels but requires additional components and complexity.

It is desirable to have a circuit driver essentially comprised of a serially connected pair of n-channel enhancement mode MOS transistors in which the output voltages are completely compatible with the input voltages needed reliably to control conventional CMOS circuitry.

SUMMARY OF THE INVENTION

The invention basically is a serially coupled pair of enhancement mode n-channel MOS transistors (denoted as an NMOS pair, or as first and second NMOS transistors) that provides an output voltage swing wide enough for it to be effectively coupled directly to the input of a CMOS transistor pair. The first NMOS transistor is conventionally denoted as the pullup transistor or device of the pair and the second NMOS transistor is conventionally denoted as the pulldown transistor or device of the pair. The second NMOS transistor is a conventional enhancement mode NMOS transistor which has had acceptor ions implanted into the surface of its channel between the source and the drain. However, the first NMOS transistor is a "natural" NMOS transistor which is defined as one free of the customary acceptor ion implant into the surface of its channel between the source and the drain.

We have found that the presence of a conventional enhancement mode NMOS transistor in the pulldown position is found to buffer sufficiently any adverse effect of the natural NMOS transistor in the pullup role so that reliable operation becomes feasible.

The invention will be better understood from the following more detailed description taken in conjunction with the accompanying drawing and appended claims.

enhancement mode NMOS transistor, a natural enhancement mode NMOS transistor and a depletion mode NMOS transistor.

It is to be noted that the drawings are not to scale.

DETAILED DESCRIPTION

Figure 1:
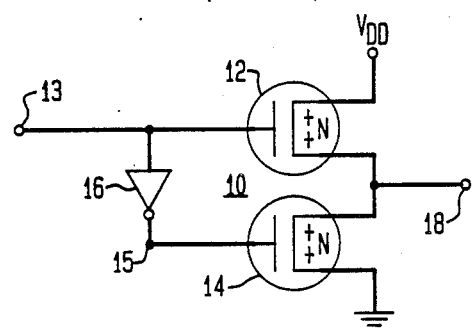
FIG. 1 is a circuit schematic of a prior art NMOS driver circuit.
Figure 2:
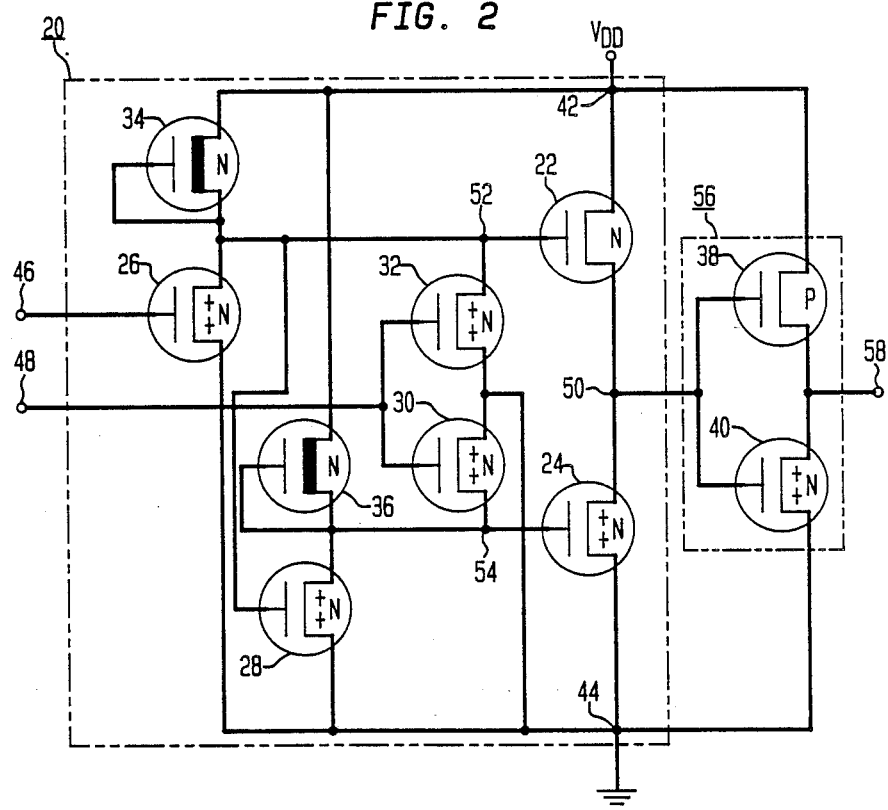
FIG. 2 is a circuit schematic of an NMOS driver circuit in accordance with the present invention coupled to a conventional CMOS inverter circuit.

Referring now to FIG. 2, there is shown within the larger dashed line rectangle a driver circuit 20 in accordance with the invention. An output terminal 50 of driver circuit 20 is coupled to gates of a conventional complementary MOS (CMOS) inverter circuit 56 (shown within the smaller dashed line rectangle) which comprises enhancement mode p-channel MOS transistor 38 and an enhancement mode n-channel MOS transistor 40. The drains of transistors 38 and 40 are coupled together to an output terminal 58 of inverter 56. Driver circuit 20 comprises a "natural" enhancement mode n-channel transistor 22, conventional enhancement mode n-channel MOS transistors 24, 26, 28, 30 and 32, and conventional depletion mode n-channel MOS transistors 34 and 36. The source of transistor 22 is coupled to the drain of transistor 24 and to output terminal 50 of driver circuit 20. The combination of transistors 22 and 24 function essentially like transistors 12 and 14 of FIG. 1 except that the high "1" output level generated at output terminal 50 is higher in voltage level than is generated on output terminal 18 of driver circuit 10 of FIG. 1. This, in some applications, allows driver circuit 20 to be directly connected to the CMOS inverter circuit 56 and thus eliminates the need for an interface or voltage amplifier circuit between the two.

Transistor 22 is denoted as a pullup transistor or pullup device since, when it is heavily biased on (enabled), the voltage of output terminal 50 is set (pulled up) to a level that is close to the level of a voltage source Vdd, which is coupled to the drains of transistors 22, 34, 36 and 38 and to a terminal 42. Transistor 24 is denoted as a pulldown transistor or pulldown device since, when it is heavily biased on, the voltage on the output terminal 50 is set (pulled down) to a level that is at or close to ground potential, which is coupled to the sources of transistors 24, 26, 28, 30, 32 and 40 and to a terminal 44. N-channel transistors 24, 26, 28, 30, 32 and 40 each show a double plus (++) in the channel region thereof, which indicates that they are conventional enhancement mode MOS transistors in which a p-type impurity was implanted in the surface of the channel thereof to insure against inadvertent inversion of the channel and to increase the threshold voltage of each transistor typically to 0.7 volts (plus or minus 0.2 volts) at zero back gate bias. Transistor 22 is a "natural" enhancement mode MOS transistor in which the surface of its channel did not have its conductivity changed but is essentially just that of the conductivity of the substrate (not shown in this figure) in which it is formed. The threshold voltage of transistor 22 is typically about 0 volts (plus or minus about 0.2 volts) at zero gate back bias. Transistors 34 and 36 are conventional n-channel depletion mode MOS transistors, which is indicated by the heavy vertical line through the channel of each that joins the drain and source of each. The channel area of each of the transistors 34 and 36 is an n-type region (not shown in this figure) which joins the drain and source regions (not shown in this figure).

The gates of transistors 22 and 28 are coupled to the gate and source of transistor 34, to the drains of transistors 26 and 32 and to a terminal 52. The gate of transistor 24 is coupled to the gate and source of transistor 36, to the drains of transistors 28 and 30 and to a terminal 54. The gate of transistor 26 is coupled to a first input control terminal 46 of driver circuit 20. Transistors 26 and 34 act as a first inverter circuit, and transistors 28 and 36 act as a second inverter circuit. The gates of transistors 30 and 32 are coupled to a second control input terminal 48 of driver circuit 20. Transistors 30 and 32 allow driver circuit 20 to be operated in a tri-state mode in which output terminal 50 is essentially isolated from all other portions of driver circuit 20 and essentially floats in potential or is set in potential by some other circuit (not shown) coupled to terminal 50.

Driver circuit 20 is typically operated as follows: A "1" input signal (a signal having a voltage level at or close to the level of Vdd) applied to terminal 48 biases on both transistors 30 and 32 which then cause terminals 52 and 54 to be set to a voltage level at or near ground potential independent of the voltage of terminal 46. These conditions bias off transistors 22 and 24 and allow terminal 50 to float in potential. This is the tri-state condition. A "0" (a signal having a voltage level at or near ground potential) applied to terminal 48 biases off transistors 30 and 32 and, therefore, allows the potentials of terminals 52 and 54 to be controlled by a voltage signal applied to input terminal 46. With a "0" applied to input terminal 48, a "1" or a "0" can be applied to terminal 46. A "1" applied to terminal 46 biases on transistor 26 which causes the potential of terminal 52 to be pulled down to a voltage near ground potential. Transistor 34 is typically only one-tenth the size of transistor 26 and, thus, even though both are on and conducting, the voltage of terminal 52 is at about +0.2 volts. This results in transistor 22 being only weakly biased on. The +0.2 volts on terminal 52 biases off transistor 28, which results in the potential of terminal 54 assuming the level of Vdd since transistor 36 is always on. This heavily biases on transistor 24 and, thus, the voltage of output terminal 50 is set (pulled down) to a level at or near ground potential.

If the signal applied to terminal 46 is now switched to "0", then transistor 26 is biased off and terminal 52 is set (pulled up) to the voltage level of Vdd. This heavily biases on transistor 22 and biases on transistor 28. Transistor 36 is designed to be about one-tenth of the geometry of transistor 28 and, accordingly, terminal 54 is set to a voltage near ground potential (about +0.2 volts), which biases off transistor 24. Accordingly, the voltage of output terminal 50 is set (pulled up) to a level of Vdd less the threshold voltage (Vth) of transistor 22 (which is about 0 volts) less the body voltage loss associated with transistor 22. The output "1" level of drive circuit 20 is theoretically about 0.7 volts higher than the output "1" voltage level generated by driver circuit 10 of FIG. 1.

Driver circuit 20 has been fabricated in integrated circuit form on a single silicon chip with transistors 22 and 24 having channel width-to-length ratios of 2030/7 and 1330/7, respectively. With Vdd=4.5 and +5.5. volts, the "1" voltage measured at output terminal 50 was +3.988 and +4.645 volts, respectively. CMOS inverter circuit 56 was fabricated on a separate integrated circuit chip and was appropriately connected to Vdd and ground potential.

Driver circuit 10 of FIG. 1 has been fabricated in integrated circuit form on a single silicon chip with transistors 12 and 14 having channel width-to-length ratios of 1740/6 and 1140/6, respectively. With Vdd=+4.5 and +5.5 volts, the "1" voltage measured at output terminal 18 was +3.39 and +4.15 volts, respectively. It is thus apparent that, with these embodiments, the output "1" voltage of driver circuit 20 of FIG. 2 is typically about +0.5 to +0.6 of a volt higher than that of the output "1" voltage of circuit driver 10 of FIG. 1. This greater output voltage level enables circuit driver 20 to directly drive conventional CMOS circuitry.

The preparation of a silicon chip to include a conventional enhancement mode n-channel MOS transistor, a natural enhancement mode n-channel transistor and depletion mode n-channel MOS transistors need involve only mask changes as compared to the conventional processing of a silicon substrate that includes only conventional enhancement mode n-channel MOS transistors and depletion mode n-channel MOS transistors. In particular, the only change that needs be made is add a mask used before the threshold implant step to block the implant into those surface regions of the substrate that will form the desired natural NMOS transistor(s) and the depletion NMOS transistors. The natural n-channel enhancement mode MOS transistor, the conventional n-channel enhancement mode MOS transistors, and the conventional depletion mode n-channel MOS transistors can all be fabricated on a single silicon substrate as is shown below.

Typically, there is processed a relatively large wafer that is eventually diced into a number of chips, each of which includes a large number of transistors appropriately interconnected into an integrated circuit. For the sake of convenience, only so much of the wafer as is needed to house one natural and one conventional enhancement mode n-channel MOS transistor and one depletion mode n-channel MOS transistor is shown in the figures.

Figure 3A:
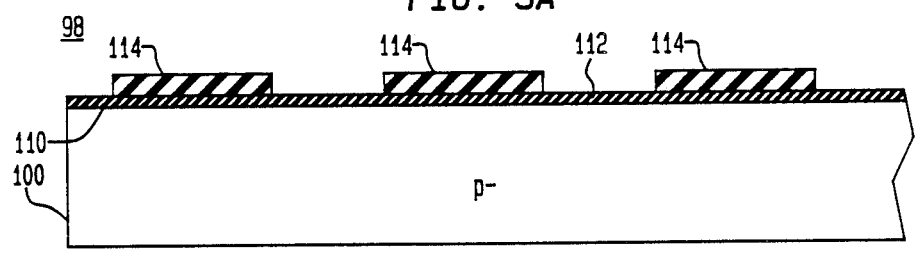
FIGS. 3A, 3B, 3C, 3D, 3E, 3F, 3G and 3H are cross sections of a portion of a silicon wafer at various stages in its processing to form therein a conventional (normal)

Referring to FIG. 3A, there is shown a portion of a monocrystalline silicon wafer 98 that serves as a substrate 100 in the processing which results in the fabrication of both enhancement mode conventional and natural n-channel MOS transistors and conventional depletion mode n-channel MOS transistors. Typically, the substrate 100 is cut so that its top surface 110 corresponds to a <100> crystal plane and is of relatively lightly doped p-type, designated by p-type in the drawing. A typical doping is between $1 \times 10^{14}$ and $1 \times 10^{15}$ impurities/cm$^3$.

The illustrative processing begins by forming on the top surface 110 a plurality of thick field oxide regions, typically at least 5000 Angstroms thick, that will serve to isolate laterally the active surface regions of individual transistors. To this end, there is first formed over the surface 110 a relatively thin (e.g., 700 Angstroms) layer 112 of silicon oxide (typically silicon dioxide). It is to be noted that the layers variously denoted herein as of silicon oxide or oxide are predominantly of silicon dioxide, but it is customary in the art to describe them as of silicon oxide or simply oxide.

The formation of the oxide layer 112 is followed by the deposition of a thicker layer 114 (e.g., typically about 1000 Angstroms thick) of silicon nitride that is patterned to expose the underlying silicon oxide layer 110 only where the thick field oxide regions are to be formed. The resultant at this stage is shown in FIG. 3A.

Figure 3B:
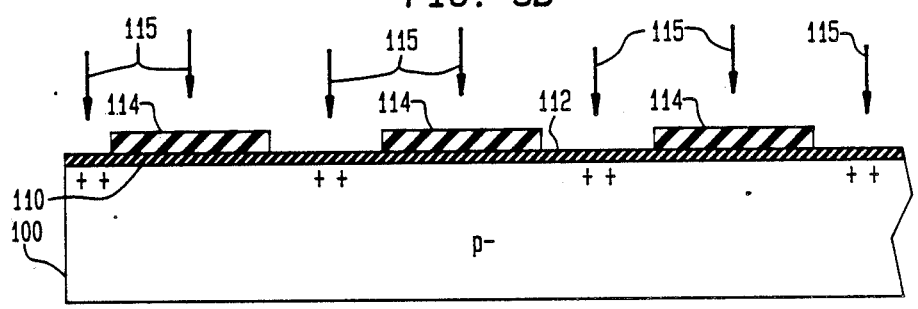

However, before formation of the field oxide regions, it is usual to implant the substrate 100 with acceptor ions to increase the acceptor doping in regions of the substrate 100 that will underlie the field oxide regions. This serves advantageously to reduce any tendency for such regions to experience undesired surface inversion during operation. A typical field implant is a boron implant at a dosage of about $6.2 \times 10^{12}$ impurities-cm$^2$ at an accelerating voltage of about 76 KeV. In conventional fashion, in FIG. 3B the implanted regions are indicated by plus signs and the boron ions by the arrows 115.

Figure 3C:
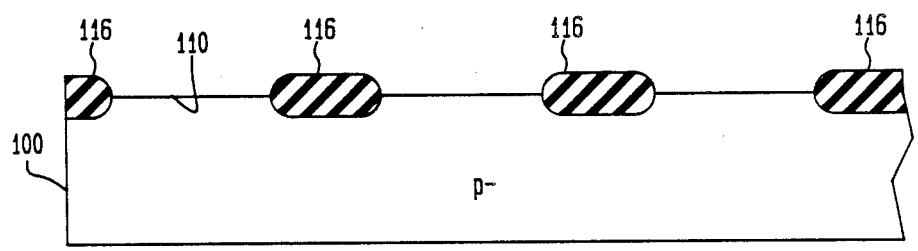

After the boron has been implanted, the substrate 100 is heated in an oxidizing ambient in the usual fashion for a time adequate to form the thick field oxide regions, typically about 10,500 Angstroms thick. Then the silicon nitride mask 114 and the thin oxide layer 112 are removed to leave the resultant seen in FIG. 3C in which the surface 110 of substrate 100 is divided by field oxide regions 116.

At this stage, the substrate 100 is ready for the gate oxidation. To this end, the substrate 100 is again heated in an oxidizing ambient for a time to form over the exposed silicon a thin gate oxide layer 119, typically about 650 Angstroms thick, seen in FIG. 3D.

After formation of this gate oxide layer 119, the substrate 100 is ready to receive the accepter ion implant customarily used to set the potential of the silicon surface 110 appropriate for the enhancement mode desired. This implant, termed the threshold implant, is a shallow implant and serves to neutralize the tendency of a silicon surface 110 to behave as n-type, as discussed earlier.

Figure 3D:
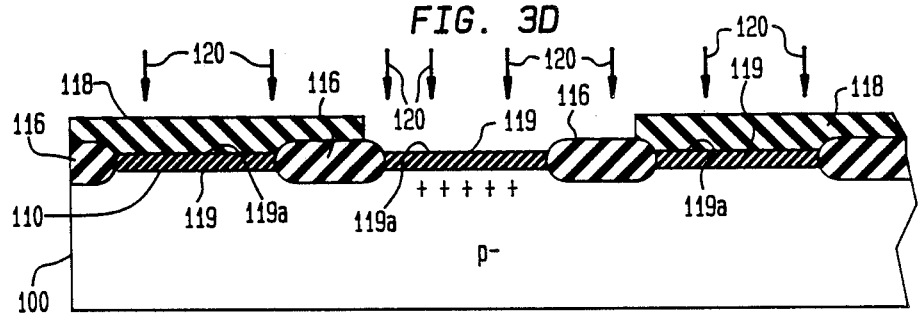

To prepare a chip of the kind that is a feature of the present invention, it is necessary to block the introduction of such acceptor ions into the channel underlying the gate of the natural n-channel MOS transistor, so that it will have the low threshold voltage desired for the practice of the invention. To this end, as shown in FIG. 3D, a photoresist mask 118 is provided over a top surface 119a of the gate oxide layer 119 to block selectively passage of the implanted ions denoted by the arrows 120. A typical dosage is about $3.3 \times 10^{11}$ impurities-cm$^2$ at an accelerating voltage of about 35 KeV. The boron implanted regions are indicated again by plus signs.

After the removal of the photoresist mask 118, further processing is conventional.

Figure 3E:
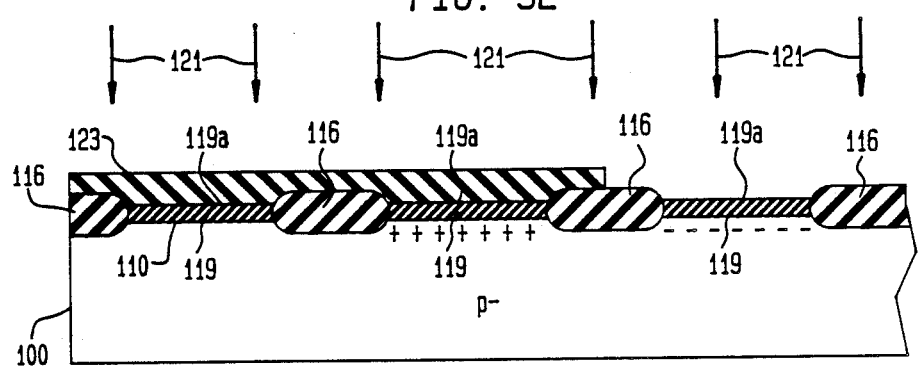

First, it is usual to provide a donor implantation into the active surface region of the depletion mode NMOS transistor. To this end, as shown in FIG. 3E, a photoresist mask 123 is provided over the surface of the substrate that exposes only such active surface area. Then the substrate 100 is irradiated with phosphorus ions, typically $5.2 \times 10^{11}$ impurities-cm$^{-2}$ at an accelerating voltage of about 120 KeV. The implanted donor ions are indicated by minus signs. After the later drive-in, such implanted ions convert a surface layer of the substrate 100 to lightly doped n-type conductivity for use by the depletion NMOS transistor.

Figure 3F:
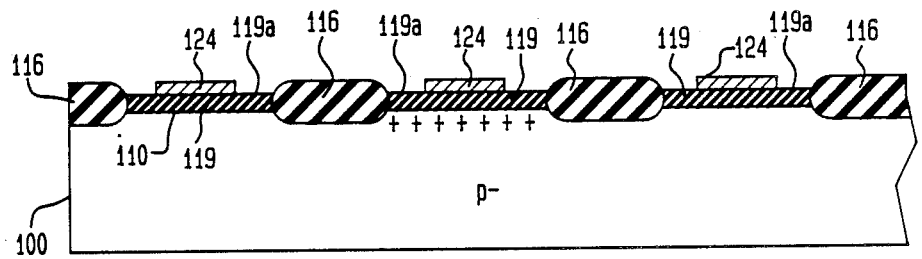

The next step is the provision of gate electrodes 124 to the various transistors. Generally, to this end, a polycrystalline silicon layer is first deposited over the surface of the wafer, typically several thousand Angstroms thick. This layer is then patterned to leave portions that are to serve as the gate electrodes 124, as shown in FIG. 3F.

This is then typically followed by an implantation with donor ions to form the desired heavily doped n-type source and drain zones of each of the transistors. An illustrative dosage is about 4 x 15 arsenic ions-cm$^2$ at an accelerating voltage of about 100 KeV. This implantation also serves to increase the conductivity of the polysilicon electrodes 124 desirably.

Figure 3G:
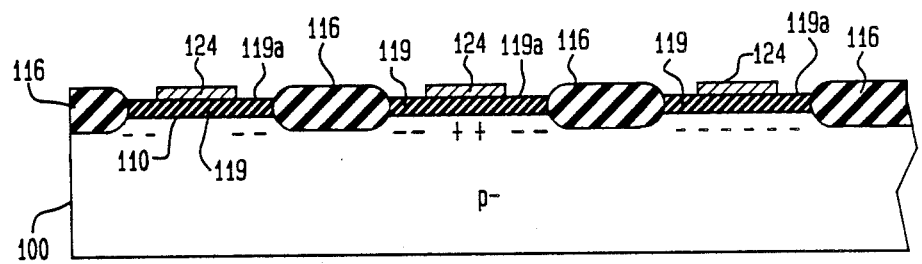

In FIG. 3G, the donor implanted regions are denoted by minus signs and the arsenic ion beam by arrows 128.

Figure 3H:
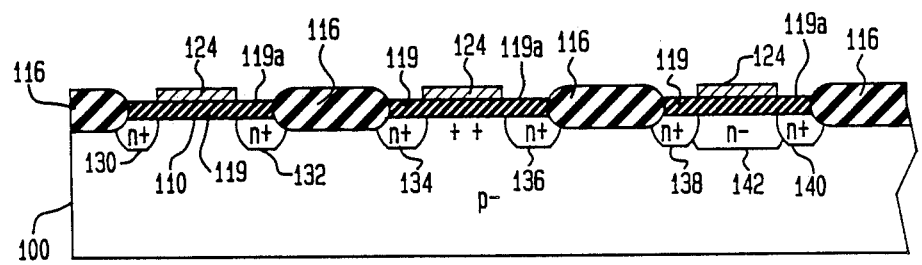

This generally is followed by a heating step to anneal any damage by the implant and to drive in the implanted arsenic to form the various heavily doped source and drain regions desired. FIG. 3H shows the results. Heavily doped n-type regions (n+) 130, 132, 34, 136, 138 and 140 are formed in the substrate 100. Of these, regions 130 and 132 can serve interchangeably as the source and drain of the natural enhancement mode NMOS transistor 22 shown in FIG. 2; regions 134 and 136 can serve interchangeable as the source and drain of the conventional enhancement mode NMOS transistor 24 shown in FIG. 2; and regions 138 and 140 are interchangeable as the source and drain of the depletion mode NMOS transistor of FIG. 2. Additionally, the implanted phosphorus ions have formed the lightly-doped n-type channel region 142 of the depletion mode NMOS transistors.

Finally, there remains the provision of suitable low resistance contacts to the various sources, drains and gates. Various techniques are known for this purpose and are independent of the present invention.

Typically, to provide the desired contacts, a metal layer, illustratively an aluminum-copper-silicon alloy, is deposited over the substrate and then patterned to leave portions that serve as the source, drain and gate electrode contacts 150 of the various transistors seen in FIG. 3H.

It is to be understood that the specific embodiment described is merely illustrative of the spirit and scope of the invention. Various modifications may be devised without departing from such spirit and scope. For example, the circuitry coupled to terminals 52 and 54 to control the biasing of transistors 22 and 24 can be easily modified in a variety of ways.

The embodiments of the invention in which an exclusive property or privilege is claimed are defined as follows:

1. Circuitry comprising first (pullup) and second (pulldown) enhancement mode n-channel MOS transistors in a common p-type silicon substrate, each transistor comprising n-type source and drain regions spaced apart along said substrate and gates spaced from the substrate by a gate oxide layer extending between the source and drain regions, the source-drain paths of the two transistors being connected in series, and the gates adapted to be driven in opposite phase, characterized in that the surface of the substrate portion of the source-drain path of the second transistor includes a doping of accepter ions higher than in a bulk portion of the substrate for setting the surface potential but the surface of the substrate portion of the source-drain path of the first transistor is free of doping with acceptor ions higher than the bulk of the substrate.

2. The circuitry of claim 1 further characterized in that the second transistor has a relatively high threshold voltage and the first transistor has a relatively low threshold voltage.

3. The circuit of claim 1 in which the threshold voltage of the first transistor is about 0 volts and the threshold voltage of the second transistor is about 0.7 volts.

4. A combination comprising an NMOS transistor pair including a pullup NMOS transistor and a pulldown NMOS transistor, an output node, a CMOS transistor pair including a PMOS pullup transistor and an NMOS pulldown transistor, an input node, with the output node of the NMOS transistor pair being coupled directly to the input node of the CMOS transistor pair, and the NMOS transistor pair are in a common substrate, said combination being further characterized in that the pullup transistor of the pair is a natural enhancement mode MOS transistor, as defined, and the pulldown transistor of the pair is a standard enhancement mode MOS transistor, as defined.

5. A circuit comprising:
an NMOS transistor pair in a common substrate comprising a pullup NMOS enhancement mode transistor having a relatively low threshold voltage and a pulldown NMOS enhancement mode transistor having a relatively high threshold voltage, each having a source, drain and gate, the source-drain paths of the two NMOS transistors being connected in series and an output terminal coupled to a terminal between the two transistors;
a CMOS transistor pair comprising a pullup PMOS enhancement mode transistor and a pulldown enhancement mode NMOS transistor, each having a source, drain and gate, the source-drain paths of the PMOS and NMOS transistors being coupled in series, an input terminal coupled to the gates of the PMOS and NMOS transistors, and an output terminal connected to a terminal between the source-drain paths of the two transistors; and
the output terminal of the NMOS transistor pair being coupled directly to the input terminal of the CMOS pair.

6. The circuit of claim 5 in which the threshold voltage of the pullup transistor of the NMOS transistor pair is about 0 volts at zero back gate bias, and the threshold voltage of the NMOS transistor is about 0.7 volts at zero back gate bias.

7. In combination:
an n-channel transistor pair, including a first enhancement mode pullup transistor and a second enhancement mode pulldown transistor, each having a source, a drain, a channel, and a gate, the two transistors having their source-drain paths coupled in series with an output terminal therebetween, the second pulldown transistor having a channel that comprises a lightly doped p-type substrate whose surface includes added impurities for setting the threshold voltage of the second pulldown transistor to about 0.7 volts and the first pullup transistor having a channel that comprises a lightly doped p-type substrate that has provided a threshold voltage to the transistor of about 0 volts;
a CMOS transistor pair comprising an enhancement mode p-channel pullup transistor and an enhancement mode n-channel pulldown transistor, each having a source, a drain, a channel and a gate, the two CMOS transistors having their source-drain paths serially connected;
means for applying an input signal in opposite phases to the gates of the two transistors of the n-channel transistor pair; and
means for connecting the output terminal of the n-channel transistor pair directly to each of the gates of the two transistors of the CMOS transistor pair.

8. Circuitry comprising:
a first enhancement mode n-channel MOS transistor having a channel region which is a portion of the bulk of a semiconductive substrate and which has essentially the same conductivity concentration as the bulk portion of the substrate;
a second enhancement mode n-channel MOS transistor having a channel region which is a portion of the bulk of a semiconductive substrate and which has a greater conductivity concentration than the bulk portion of the substrate such that the threshold voltage of the second transistor is higher than the threshold voltage of the first transistor;

the first and second transistors each having a gate, drain and source with the source of the first transistor being coupled to the drain of the second transistor; and the gates of the first and second transistors being adapted to be biased by control signals which are logical opposites of each other.

9. The circuitry of claim 8 further comprising a first inverter circuit having an input coupled to the gate of the first transistor and having an output coupled to the gate of the second transistor.

10. The circuitry of claim 8 further comprising a second inverter circuit having an input adapted to serve as the circuitry input and having an output coupled to the gate of the first transistor.

11. The circuitry of claim 10 further comprising means coupled to the gates of the first and second transistors for selectively simultaneously biasing off the first and second transistors.

12. The circuitry of claim 11 wherein:

the first inverter circuit comprises a third depletion mode n-channel MOS transistor and a fourth enhancement mode n-channel MOS transistor with each having a gate, drain and source;

the gate and source of the third transistor being coupled to the drain of the fourth transistor and to the gate of the first transistor;

the gate of the fourth transistor being coupled to a circuitry input terminal;

the second inverter circuit comprises a fifth depletion mode n-channel MOS transistor and a sixth enhancement mode n-channel MOS transistor with each having a gate, drain and source; and the gate and source of the fifth transistor being coupled to the drain of the sixth transistor and to the gate of the second transistor.

13. The circuitry of claim 12 wherein:

the means for selectively simultaneously biasing off the first and second transistors comprises seventh and eighth enhancement mode n-channel MOS transistors with each having a gate, drain and source;

the drains of the seventh and eighth transistors being coupled to the gates of the first and second transistors, respectively; and the gates of the seventh and eighth transistors being coupled together and being coupled to a second input terminal of the circuitry.

14. In combination:

a first enhancement mode n-channel MOS transistor having a channel region which is a portion of the bulk of a semiconductive substrate and which has essentially the same conductivity concentration as the bulk portion of the substrate;

a second enhancement mode n-channel MOS transistor having a channel region which is a portion of the bulk of a semiconductive substrate and which has a greater conductivity concentration than the bulk portion of the substrate such that the threshold voltage of the second transistor is higher than the threshold voltage of the first transistor;

the first and second transistors each having a gate, drain and source with the source of the first transistor being coupled to the drain of the second transistor;

the gates of the first and second transistors being adapted to be biased by control signals which are logical opposites of each other;

a third enhancement mode p-channel MOS transistor and a fourth enhancement mode n-channel MOS transistor with each having a gate, drain and source;

the drains of the third and fourth transistors being coupled together; and the gates of the third and fourth transistors being coupled together and being directly connected to the source of the first transistor and to the drain of the second transistor.

15. The combination of claim 14 wherein the third and fourth transistors are formed in a second semiconductive substrate.

16. The combination of claim 15 wherein the drain of the first transistor and the source of the third transistor are adapted to be coupled to the same voltage source, and the sources of the second and fourth transistors are adapted to be coupled to the second voltage source.

* * * * *